United States Patent
De Vaan

(10) Patent No.: US 10,257,935 B2
(45) Date of Patent: Apr. 9, 2019

(54) METHOD FOR MANUFACTURING A PRINTED CIRCUIT BOARD ASSEMBLY BASED ON PRINTED ELECTRONICS

(71) Applicant: SIGNIFY HOLDING B.V., Eindhoven (NL)

(72) Inventor: Adrianus Johannes Stephanus Maria De Vaan, 'S-Hertogenbosch (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 353 days.

(21) Appl. No.: 14/903,295

(22) PCT Filed: Jun. 27, 2014

(86) PCT No.: PCT/EP2014/063708
§ 371 (c)(1),
(2) Date: Jan. 7, 2016

(87) PCT Pub. No.: WO2015/003929
PCT Pub. Date: Jan. 15, 2015

(65) Prior Publication Data
US 2016/0150648 A1    May 26, 2016

(30) Foreign Application Priority Data

Jul. 9, 2013    (EP) .................................... 13175646

(51) Int. Cl.
*H05K 3/30* (2006.01)
*H05K 1/18* (2006.01)
(Continued)

(52) U.S. Cl.
CPC ........... *H05K 1/181* (2013.01); *H05K 1/0298* (2013.01); *H05K 1/056* (2013.01); *H05K 3/0011* (2013.01);
(Continued)

(58) Field of Classification Search
CPC ...... H05K 1/0298; H05K 1/056; H05K 1/181; H05K 3/0011; H05K 3/12; H05K 3/1216;
(Continued)

(56) References Cited

U.S. PATENT DOCUMENTS 4,710,419 A * 12/1987 Gregory ............ B29C 45/14639
174/255
5,003,693 A    4/1991 Atkinson et al.
(Continued)

FOREIGN PATENT DOCUMENTS

| DE | 1243746 B | 7/1967 |
|---|---|---|
| DE | 19807202 A1 | 8/1999 |
| EP | 0477981 A2 | 4/1992 |
| WO | 2010/002156 A2 | 1/2010 |
| WO | 2010/043540 A1 | 4/2010 |
| WO | 2015101494 A1 | 7/2015 |

*Primary Examiner* — Paul D Kim
(74) *Attorney, Agent, or Firm* — Akarsh P. Belagodu

(57) ABSTRACT

A printed circuit board assembly (1) and a method for manufacturing a printed circuit board assembly (1) are provided. The method comprises: providing a substrate (2), printing a circuit pattern on the substrate (2) thereby forming a bottom layer (4a) of an uncured conductive material (7) and a top layer (4b) of an insulating material (8), arranging at least one electronic component (5), having at least one electrical connection part (6), on the top layer (4b) of the circuit pattern, the at least one electrical connection part (6) of the at least one electronic component (5) forming at least one electrical connection (9) with the bottom layer (4a) comprising the uncured conductive material (7), and, after arranging said at least one electronic component (5) on the top layer (4b), curing the conductive material (7) and the insulating material (8). By this method, the conductive material (7) mechanically secures said at least one electronic component (5) to the substrate (2).

11 Claims, 2 Drawing Sheets

(51) Int. Cl.
  *H05K 3/12* (2006.01)
  *H05K 3/32* (2006.01)
  *H05K 1/02* (2006.01)
  *H05K 1/05* (2006.01)
  *H05K 3/00* (2006.01)
  *H05K 3/46* (2006.01)

(52) U.S. Cl.
  CPC .............. *H05K 3/12* (2013.01); *H05K 3/303* (2013.01); *H05K 3/321* (2013.01); *H05K 3/46* (2013.01); *H05K 3/1216* (2013.01); *H05K 3/1241* (2013.01); *H05K 3/1283* (2013.01); *H05K 2201/10106* (2013.01); *H05K 2203/1189* (2013.01)

(58) Field of Classification Search
  CPC .... H05K 3/1241; H05K 3/1283; H05K 3/321; H05K 3/303; H05K 3/46
  See application file for complete search history.

(56) References Cited

U.S. PATENT DOCUMENTS

| | | |
|---|---|---|
| 5,090,122 A | 2/1992 | Kitagawa |
| 6,482,289 B1 | 11/2002 | Fang et al. |
| 6,570,774 B1 * | 5/2003 | Moriwaki ............. H02M 7/003 174/260 |
| 9,648,755 B2 * | 5/2017 | De Vaan ............... H05K 1/0284 |
| 2008/0100772 A1 * | 5/2008 | Lin ..................... H01L 25/0753 349/61 |
| 2009/0155597 A1 | 6/2009 | Kropp et al. |
| 2009/0158581 A1 * | 6/2009 | Nguyen ................ H05K 3/108 29/592.1 |
| 2009/0201680 A1 | 8/2009 | Chang et al. |
| 2010/0052163 A1 | 3/2010 | Ouchi |
| 2011/0154661 A1 | 6/2011 | Park et al. |
| 2012/0030942 A1 | 2/2012 | Oh et al. |
| 2013/0082298 A1 | 4/2013 | Golle et al. |

* cited by examiner

METHOD FOR MANUFACTURING A PRINTED CIRCUIT BOARD ASSEMBLY BASED ON PRINTED ELECTRONICS

CROSS-REFERENCE TO PRIOR APPLICATIONS

This application is the U.S. National Phase application under 35 U.S.C. § 371 of International Application No. PCT/EP2014/063708, filed on Jun. 27, 2014, which claims the benefit of European Patent Application No. 13175646.2, filed on Jul. 9, 2013. These applications are hereby incorporated by reference herein.

FIELD OF THE INVENTION

The present disclosure relates to a method for manufacturing a printed circuit board assembly based on printed electronics. The disclosure also relates to a printed circuit board assembly, in particular for use in solid state light emitting (SSL) devices.

BACKGROUND OF THE INVENTION

Printed electronics is a set of printing methods for creating electrical devices on substrates. The technology is already commonly used to produce a variety of electrical modules and is seen as an emerging area that promises drastic cost reductions for electronic sub modules, while simultaneously setting new and promising directions for further integrations and new design solutions.

In a manner similar to conventional printing, printed electronics involves applying ink layers one on top of another. Nearly all industrial printing methods suitable for defining patterns on material can be employed. Typically, standard printing equipment or other low-cost equipment, such as screen printing, flexography, gravure, offset lithography and inkjet, are used.

An important area of application for printed electronics is that of SSL devices. US 2013/0082298 discloses an LED die disposed on a substrate and connected with a printed conductor. The substrate has an adhesive applied to one or more of its sides.

US 2011/0154661 A1 discloses a method for fabricating a printed circuit board by sequentially applying by ink-jet printing a conductor-containing first ink on a base substrate and an insulator-containing second ink onto the base substrate surrounding the conductive pattern to form a printed circuit board, mounting an element on the printed circuit board such that an electrode of the element contacts the conductive layer and curing the conductive layer at a high temperature.

Several directions for further development within the area of printed electronics can be identified. For example, it is desirable to find new ink and substrate materials which allow for a more effective manufacturing process or enable the provision of new features in applications.

SUMMARY OF THE INVENTION

A general objective of the present disclosure is to provide an improved or alternative method for producing a printed circuit board assembly based on printed electronics. Specific objectives include providing an improved or alternative printed circuit board for SSL devices, such as LED light engines, LED lamps and LED luminaries.

The invention is defined by the independent claims. Embodiments are set forth in the dependent claims, the description and the drawings.

According to a first aspect, there is provided a method for manufacturing a printed circuit board assembly. The method comprises the following steps: providing a substrate, printing a circuit pattern on the substrate thereby forming a bottom layer of an uncured conductive material and a top layer of an insulating material, arranging at least one electronic component, having at least one electrical connection part, on the top layer of the circuit pattern, the at least one electrical connection part of the at least one electronic component forming at least one electrical connection with the bottom layer comprising the uncured conductive material, and, after arranging said at least one electronic component on the uncured conductive material, curing the conductive material.

By this method, the cured conductive material provides the electrical connections as well as the mechanical fixations of the electronic components. The number of manufacturing steps can thus be reduced, since it is not necessary to fix the electronic components to the substrate by soldering or by using adhesives or mechanical fasteners. This renders a simpler and more economical manufacturing process possible. Moreover, the number of interfaces between the electronic components and the substrate can be reduced, which may result in increased thermal conductivity enabling heat to be removed more efficiently from the electronic components via the substrate.

The substrate can be, for example, a plastic thin film or a metal plate, such as a steel or aluminum plate. The substrate may include an insulating material. The substrate can be transparent or non-transparent, and it can be flexible or rigid. The fact that a variety of substrate materials can be used further increases the possible uses of the substrate. For example, the substrate can be one part of a housing of a luminaire and/or provide cooling of SSL devices. The substrate may be a laminate such as an aluminum film on an FR1 substrate. The substrate may be a thin film, like a plastic thin film or an aluminum film having an adhesive layer such that the substrate can be laminated onto another substrate or on a part of the housing of a luminaire. The substrate may be a laminate such as a white coated metal plate or film, or a metal plate or film covered with an insulating layer. A substrate in the form of a metal plate or film is preferably covered with an insulating layer that can handle high curing temperatures to cure the conductive material after being printed, such as SiO2, SiN3, or a polyamide layer. Higher curing temperatures of the conductive material can result in an increased conductivity of the conductive paths, which may enable the provision of thinner or smaller conductive paths. This may, in turn, lower the cost of the printed circuit board assembly since less conductive material is required.

The at least one electronic component may comprise an SSL die which can include, for example, a semiconductor light emitting diode, an organic light emitting diode, a polymer light emitting diode and/or a laser diode. The at least one electronic component is provided with one or more electrical connection parts providing one or more electrical interfaces to the conductive material.

The conductive material may be one part of a compound comprising the insulating material which forms an insulator after curing. The compound can be a suspension which forms layers after printing. The insulating material may help mechanically secure the at least one electronic component to the substrate. The use of compounds of materials having different properties expands the possibilities for producing a printed circuit board which is well adapted for a particular application.

After printing, the materials in the compound form at least two layers substantially parallel to the plane of the substrate. The layers are positioned on top of each other in a direction perpendicular to the plane of the substrate. The at least two layers comprise a conductive layer and an insulating layer. The bottom layer forms said at least one electrical connection. By the provision of such layers, the printed circuit board can be better adapted for use in certain applications. For example, an insulating layer may cover a layer forming said at least one electrical connection, thereby providing an electrical safety barrier which can help increase the reliability of the printed circuit board assembly and/or enable the fulfillment of certain legal requirements. The provision of a safety barrier may help reduce the risk of shortcuts and thereby facilitate the use of non-isolated drivers in luminaries.

Said at least two layers can provide one of specular reflection and diffuse reflection. To this end, the compound can comprise one of transparent light refracting particles and light reflective particles. Such particles are contained within one or more of the compound materials which thereby act as host materials. For example, the second material can be a host material. The transparent light refracting particles have a different refractive index than the corresponding host material. The light reflective particles can be specular reflective or diffuse reflective.

A repellent force can exist between said at least two layers. Such a force may help secure the one or more electronic components to the substrate and/or increase the probability that the compound form layers according to a desired sequence after printing. A result of such a force can be that a bottom layer, for example a layer forming electrical connections, is pulled towards the substrate and/or the electrical connection parts of the electronic components. Such a force can result in a top layer, for example an insulating layer, being pushed away from the substrate and/or the electrical connection parts of the electronic components.

The layer forming electrical connections and the insulating layer may repel each other. For example, a conductive layer, which forms the electrical connections, and the substrate may be hydrophilic, whereas the insulator layer is hydrophobic. By this configuration, the conductive layer can be formed on the substrate while the insulator layer can be pushed to the top, covering the conductive paths. Another variant is that the insulating layer and the substrate are hydrophobic and the conductive layer is hydrophilic. By this configuration, the insulating layer can be formed on the substrate, which may be a metal substrate, and the conducting layer can be formed on top of the insulator layer such that the insulator layer is providing electrical insulation between the conductive paths and the metal substrate.

The circuit pattern can be printed on the substrate using screen printing technology or inkjet printing technology. The at least one electronic component can be arranged on the printed circuit pattern using a pick-and-place machine. These are effective and apt methods for manufacturing a printed circuit board assembly, and they are particularly suitable for the present invention.

To improve the manufacturing process and/or the resulting printed circuit board assembly, said compound may comprise additives. For example, the second material may comprise an additive in the form of a colloid. Furthermore, the manufacturing method described above may comprise a step in which additional mechanical fixations, such as adhesives, screws, clamps and/or soldering, are provided in order to help secure the electronic components to the substrate.

A printed circuit board assembly can be manufactured according to the description above. The conductive material of such a printed circuit board assembly simultaneously provides the electrical connections and the mechanical fixations of the least one electronic component. All or some of the other parts of the compound may help mechanically secure the at least one electronic component to the substrate.

According to a second aspect, there is provided a printed circuit board assembly which comprises a substrate, a printed bottom layer of a conductive material and top layer of an insulating material, and at least one electronic component having at least one electrical connection part arranged on the top layer, wherein the electrical connection part of the at least one electronic component forms at least one electrical connection with the bottom layer of the conductive material. By this configuration, the at least one electronic component is mechanically secured to the substrate by the printed conductive material. Since the provision of additional fasteners is not required, such a printed circuit board can be manufactured by an effective and economical process. The at least one electronic component may comprise an SSL die, such as one of semiconductor light emitting diodes, organic light emitting diodes, polymer light emitting diodes and laser diodes.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
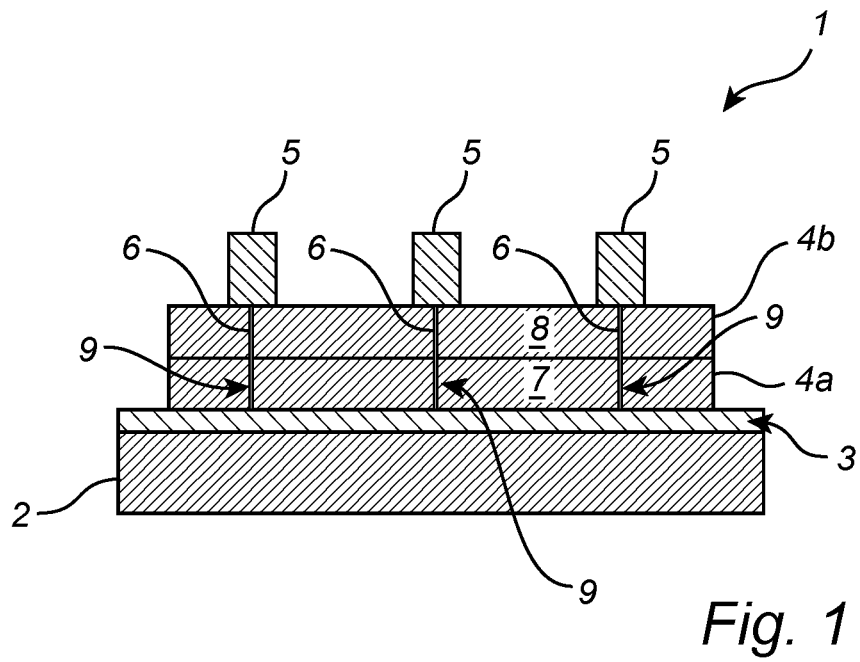
FIG. 1 is a schematic side view of a printed circuit board assembly.

FIG. 1 shows a schematic side view of a printed circuit board assembly 1 for SSL devices, such as LED light engines, LED lamps and LED luminaries, as well as other electronic products and/or sub-assemblies. The printed circuit board assembly 1 has a substrate 2 which can be transparent or non-transparent. Both flexible and rigid substrates 2 can be used. The substrate 2 can be a laminated structure. The substrate 2 can be made of, for example, glass, ceramic, steel, aluminum, plastic, wood, carton or paper. The substrate 2 can be a plate or film made of, for example, steel or aluminum. The substrate 2 can be an FR1 board or similar. The substrate 2 may include an electrically insulating material 3, such as an SiO2 layer, an SiN3 layer and/or a polymer layer. The electrically insulating material can be a laminated film or tape. For example, the substrate 2 can be a metal plate covered with a PET film, an aluminum film covered with a SiO2 layer or a white painted metal plate.

At least two layers 4a, 4b are arranged, for example by a method comprising screen printing or inkjet printing, on the substrate 2. The embodiment shown in FIG. 1 has two layers 4a, 4b, wherein the bottom layer 4a is a layer of a conductive material 7 and the top layer 4b is a layer of a second material 8. The layer 4a of the conductive material 7 forms a conductive circuit on the substrate 2. The layer 4b of a second material 8 can be insulating, thereby providing an electrical safety barrier. The layer 4b of the second material 8 can provide a protective barrier to prevent erosion of the layer 4a by atmospheric contaminations such as water. If the layers 4a, 4b have been screen printed, their combined thickness is typically about 20 μm or less, although it is possible to have thicker layers. If the layers 4a, 4b have been printed using inkjet technology, their combined thickness is typically about 3 μm or less. The conductive material 7 can be chosen from the group consisting of Ag, Cu and a conductive mixture of Ag and Cu. The second material 8 can be chosen from the group consisting of acrylates, polyurethanes, polyimides, melamine resin and melamine formaldehyde. The two layers 4a and 4b can repel each other.

The printed circuit assembly 1 has at least one electronic component 5 which is fixed to the substrate 2 by the layer 4a of the conducting material 7. Three electronic components 5 are shown in FIG. 1. The layer 4b of the second material 8 may help mechanically secure the electronic components 5 to the substrate 2. If required, additional fastening means, such as adhesives, screws and/or clamps, can be provided in order to help secure the electronic components 5 to the substrate 2. The electronic components 5 may comprise an SSL die having one or several SSL devices, such as a semiconductor light emitting diode, an organic light emitting diode, a polymer light emitting diode and/or a laser diode.

The conductive material 7 forms at least one electrical connection 9 of the electronic components 5. Each electronic component 5 has at least one electrical connection part 6, for example a metallic pin, which makes electrical contact with the conductive material 7. The electrical connection part 6 thus penetrates through the top layer 4b to electrically contact the bottom layer 4b comprising the conductive material thereby providing an electrical connection between the electronic component 5 and the conductive bottom layer 4b, as is illustrated in FIG. 1.

Figure 2:
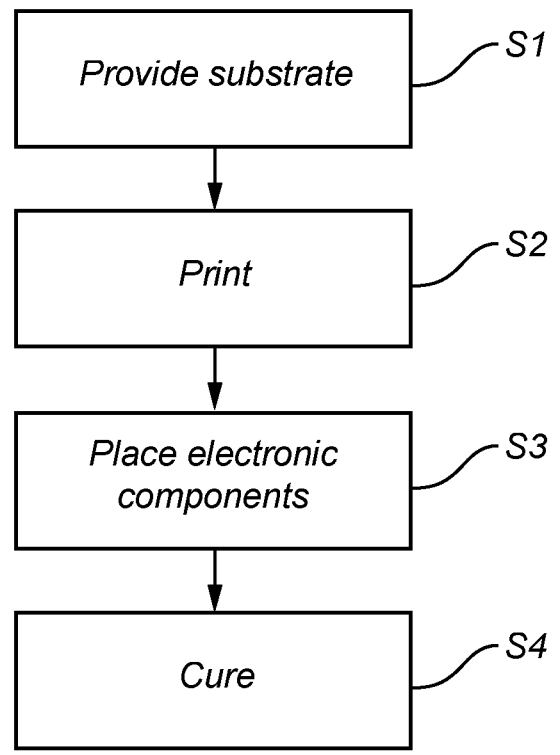
FIG. 2 is a flowchart of a method for manufacturing a printed circuit board assembly.
Figure 3A:
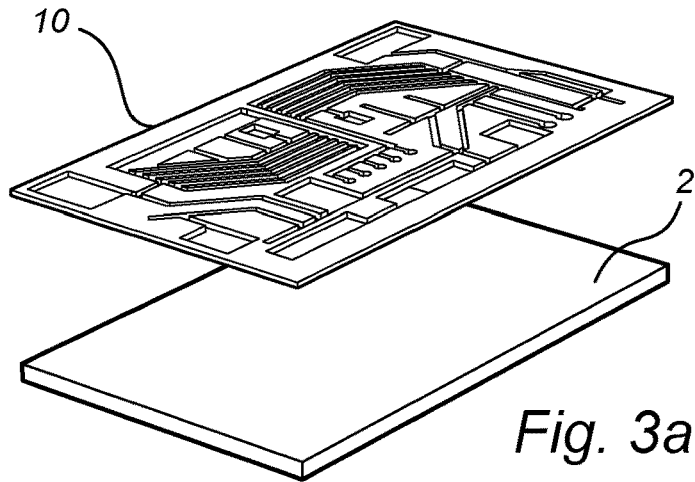
FIGS. 3a-3c are schematic illustrations of some of the steps of the method illustrated in FIG. 2.
Figure 3B:
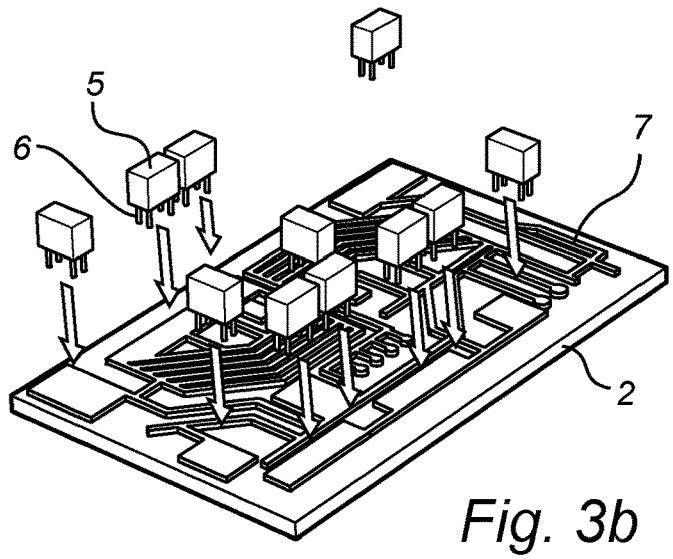
Figure 3C:
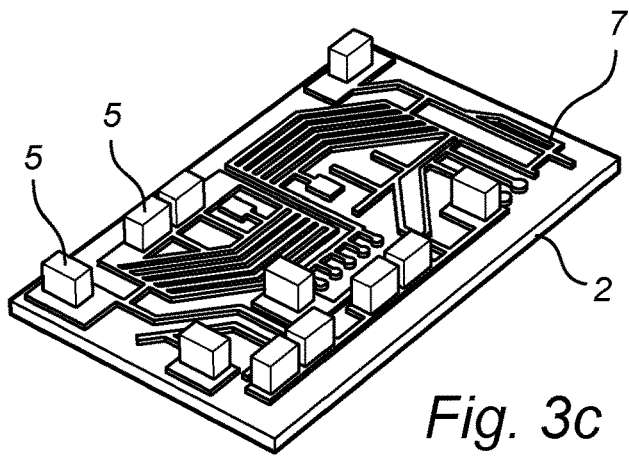

FIG. 2 is a flowchart of a method for manufacturing a printed circuit board assembly 1. Schematic illustrations of some of the steps of the method are illustrated in FIGS. 3a to 3c. In step S1, a substrate 2 for supporting a conductive material 7 and at least one electronic component 5 is provided. A schematic perspective view of the substrate 2 is shown in FIG. 3a which also shows a printing mask 10. The substrate 2 can be transparent or non-transparent, and it can be flexible or rigid. The substrate 2 can be made of any suitable material. For example, the substrate 2 can be a plate or film made of glass, PET or a metal such as aluminum. The substrate 2 can include one or more electrically insulating materials 3. The substrate 2 can, for example, be a metal plate covered by an insulating film. Such an insulating film may comprise SiO2 and/or SiN3.

In step S2, an uncured conductive material 7, which can be a paste, is printed on the substrate 2. The printing method can be, for example, screen printing or inkjet printing. After printing, the conductive material 7 forms a desired pattern on the substrate 2. The desired pattern is defined by the printing mask 10. The conductive material 7 can be part of a compound which comprises a second material 8 forming an insulator after curing. The compound can be a suspension. Various types of conductive materials 7 may be used, such as Ag printing pastes, Cu printing pastes and Ag—Cu printing pastes. The second material 8 can for example be chosen from the group consisting of acrylates, polyurethanes, polyimides, melamine resin and melamine formaldehyde. The compound may comprise additives, for example additives that create colloids in the second material 8. The use of additives may render the manufacturing process more effective.

If the conductive material 7 is one part of a compound comprising a second material 8, the printing process can result in at least two layers 4a, 4b being formed by the materials in the compound. Such layers 4a, 4b can be substantially parallel to the plane of the substrate 2 and are positioned on top of each other in a direction perpendicular to the plane of the substrate 2. As an example, the conductive material 7 and the second material 8 can form layers 4a and 4b, respectively, on the substrate 2. The second material 8 can form a top layer 4b which covers a bottom layer 4a of the conductive material 7. If screen printing is used, the combined thickness of the layers 4a, 4b is typically about 20 μm or less, although it is possible to produce even thicker layers. If inkjet technology is used, the combined thickness of the layers 4a, 4b is typically about 3 μm or less.

The compound may comprise light reflective particles. For example, the second material 8 may comprise light reflective particles. Such light reflective particles can be specular reflective or diffuse reflective. The light reflective particles can be spherical, and they can have a higher refractive index than the host material. The refractive index of the light reflective particles can be from about 1.45 to about 1.7. Examples of light reflective particles are glass spheres with a refractive index of about 1.5.

Using a compound comprising light reflective particles can result in one or more of the at least two layers 4a, 4b having optical characteristics that are desirable for certain applications. For example, the conductive material 7 can form a layer which is specular reflective. A further variant is that of the second material 8 forming a layer which is diffuse reflective due to white reflective particles included in the second material 8. Furthermore, one or more of the at least two layers 4a, 4b can help prevent degradation of the optical characteristics of another layer. The second material 8 can, for example, form a layer which covers a specular reflective layer of the conductive material 7, and thereby help prevent blackening of the conductive material 7 due to oxidization.

There can be a repellent force between the at least two layers 4a, 4b. The repellent force can be such that a bottom layer is pulled towards the substrate 2 and a top layer is pushed away from the substrate 2. For example, the conductive material 7 can form a bottom layer 4a which is pulled towards the substrate 2 and/or the at least one electrical connection parts 6 of the at least one electronic components 5. The second material 8 can form a top layer 4b which is pushed away from the substrate 2 and/or the at least one electrical connection parts 6 of the at least one electronic components 5.

In step S3, at least one electronic component 5 is placed on the substrate 2 and the still uncured conductive material 7, or two layers 4a, 4b, see FIG. 3b. A pick-and-place machine can be used to place the at least one electronic component 5 on the substrate 2 and the still uncured conductive material 7, or two layers 4a, 4b. The at least one electronic component 5 may comprise an SSL die which, in turn, may comprise one or several SSL devices, such as a semiconductor light emitting diode, an organic light emitting diode, a polymer light emitting diode and/or a laser diode. The at least one electronic component 5 can have one or more electrical connection parts 6 providing electrical interfaces to the conductive material 7. The electrical connection parts 6 penetrate through the top layer 4b of insulating material 8 to establish an electrical connection between the conductive bottom layer 4a and the at least one electronic component 5. The one or more electrical connection parts 6 may comprise metallic pins. The electrical connection parts 6 can be coated with a layer for improving the electrical connection between the electronic connection parts 6 and the conductors 7. For example, the electrical connection parts 6 can be coated with a layer of Ag.

In step S4, which succeeds the positioning of the at least one electronic component 5 on the substrate 2, the conductive material 7 is cured. The curing may be achieved through, for example, heating, radiation or the use of chemical additives. It is often desirable to use high curing temperatures because it can lead to less conductive material 7 being required and, consequently, lower production costs. To be more precise, the conductivity of the conductive material 7 after curing typically increases with increased curing temperatures. The higher the conductivity of the conductive material 7, the less conductive material 7 is required. The curing temperature can, for example, be higher than about 160° C., alternatively higher than about 200° C. or higher than about 300° C. The curing results in the conductive material 7 forming at least one electrical connection 9 of the at least one electronic component 5. Furthermore, once cured, the conductive material 7 fixes the at least one electronic component 5 to the substrate 2, see FIG. 3c. If required, additional fastening means, such as adhesives, screws and/or clamps, can be provided to help secure the at least one electronic component 5 to the substrate 2.

The person skilled in the art realizes that the present invention by no means is limited to the preferred embodiments described above. On the contrary, many modifications and variations are possible within the scope of the appended claims. For example, the method may comprise several printing steps. It is often desirable to print two or more insulating layers in order to reduce the risk of pin holes.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method for manufacturing a printed circuit board assembly, comprising:
   providing a substrate;
   printing a compound in a circuit pattern on the substrate, the compound comprising a suspension of an uncured conductive material and an insulating material together, the uncured conductive material and the insulating material configured to separate after printing thereby forming a bottom layer of the uncured conductive material covered by a top layer of the insulating material;
   arranging at least one electronic component, having at least one electrical connection part, on the top layer of the circuit pattern, the at least one electrical connection part of the at least one electronic component penetrating the top layer of the insulating material and forming at least one electrical connection with the bottom layer comprising the uncured conductive material, and, after arranging said at least one electronic component on the top layer;
   curing the uncured conductive material and the insulating material into a cured conductive material and an insulator, respectively;
   whereby the cured conductive material mechanically secures said at least one electronic component to the substrate.

2. The method according to claim 1, wherein the compound comprises additives that create colloids of the uncured conductive material in the insulating material.

3. The method according to claim 1, wherein the least one electrical connection part of the at least one electronic component is a metallic pin electrically contacting the cured or uncured conductive material of the bottom layer.

4. The method according to claim 1, wherein the compound comprises one of transparent light refracting particles and light reflective particles.

5. The method according to claim 1, wherein a repellent force is generated between the bottom layer and the top layer, whereby the bottom layer is pulled towards the substrate and the top layer is pushed away from the substrate.

6. The method according to claim 5, wherein the substrate and the uncured conductive material are hydrophilic, and wherein the insulating material is hydrophobic.

7. The method according to claim 1, wherein the substrate comprises a metal plate covered by an insulating film.

8. The method according to claim 1, wherein the insulating material is chosen from the group consisting of acrylates, polyurethanes, polyimides, melamine resin and melamine formaldehyde.

9. The method according to claim 1, wherein the uncured conductive material and insulating material are printed on the substrate using screen printing technology.

10. The method according to claim 1, wherein the uncured conductive material and insulating material are printed on the substrate using inkjet printing technology.

11. The method according to claim 1, wherein said at least one electronic component is arranged on the printed circuit pattern using a pick-and-place machine.

* * * * *